(12) United States Patent
Copeland (10) Patent No.: US 8,913,692 B1
(45) Date of Patent: Dec. 16, 2014

(54) MULTIBAND ENVELOPE TRACKING POWER AMPLIFIER

(71) Applicant: Xilinx, Inc., San Jose, CA (US)

(72) Inventor: Gregory C. Copeland, Savannah, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/088,234

(22) Filed: Nov. 22, 2013

(51) Int. Cl.
*H04L 25/49* (2006.01)
*H04B 1/04* (2006.01)

(52) U.S. Cl.
CPC ............................... *H04B 1/0475* (2013.01)
USPC .............................................. 375/297

(58) Field of Classification Search
CPC ........................... H03F 1/3247; H04L 27/368
USPC ............... 375/297, 296, 346; 330/149, 263; 455/127.1, 522
See application file for complete search history.

(56) References Cited

U.S. PATENT DOCUMENTS 8,391,809 B1 * 3/2013 Fuller ........................ 455/114.3
2013/0243121 A1 * 9/2013 Bai ................................ 375/297

OTHER PUBLICATIONS

Bassam, S., et al., "2-D Digital Predistortion (2-D-DPD) Architecture for Concurrent Dual-Band Transmitters" IEEE Transactions on Microware Theory and Techniques, vol. 59, No. 10, Oct. 2011, 2011 IEEE, pp. 2547-2553.

Ding, L., et al., "Concurrent Dual-Band Digital Predistortion", Texas Instruments, 2012 IEEE MTT-S International, Jun. 17-22, 2012, pp. 1-5, Montreal, QC, CA.

Roblin, P., et al., "Frequency-Selective Predistortion Linearization of RF Power Amplifiers", IEEE Transactions on Microwave Theory and Techniques, vol. 56, No. 1, Jan. 2008, 2007 IEEE, pp. 65-76.

Vaananen, O., et al.; "Reducing the Peak to Average Ratio of Multicarrier GSM and Edge Signals", Electronic Circuit Design Laboratory, Helsinki University of Technology, IEEE PIMRC 2002, Sep. 15-18, 2002, pp. 1-5, Lisbon, Portugal.

* cited by examiner

*Primary Examiner* — Khai Tran
(74) *Attorney, Agent, or Firm* — W. Eric Webostad (57) ABSTRACT

An apparatus relates generally to multiband power modulation. In such an apparatus, there is a first power supply and a second power supply. The first power supply and the second power supply are each narrow-banded. A digital predistorter is coupled to provide separate bands of a modulation signal for respective input of a first band of the bands to the first power supply and a second band of the bands to the second power supply. The first power supply generates a first power at a first center frequency. The second power supply generates a second power at least at a second center frequency spaced apart from the first center frequency for a wide-band configuration. The second power output from the second power supply is coupled to the first power output from the first power supply to provide a multiband power modulation output.

20 Claims, 7 Drawing Sheets

MULTIBAND ENVELOPE TRACKING POWER AMPLIFIER

FIELD OF THE INVENTION

The following description relates to communications. More particularly, the following description relates to a multiband envelope tracking power amplifier.

BACKGROUND

For two bands or carriers separated in frequency by a sufficient amount such that their in-band intermodulation distortion ("IMD") does not overlap means that a high sample rate or a large bandwidth is used to provide a cavity filter response enveloping both bands as well as both in-band IMD terms. In the past, systems may employ envelope tracking ("ET") by a single power supply for feeding a drain current to a power amplifier to improve efficiency in such power amplifier for a single band. However, providing a single power supply with sufficient bandwidth to cover a large cavity filter response adds a substantial amount of cost. For example, bandwidth for drain modulation, such as for supplying a drain current to a power amplifier, generally is at least twice the instantaneous bandwidth ("IBW") of a signal. Because of bandwidth demands in more recent communication systems, such demand has in some instances precluded use of envelope tracking in power provided to a power amplifier.

Others have used wide band switching power supplies to provide a drain current to a power amplifier for envelope tracking. Again, as bandwidth for such switching power supplies is at least twice total bandwidth of a signal, for instances with widely spaced carriers a high degree of complexity and cost is added to provide such switching power supplies. Furthermore, efficiency of such switching power supplies may be depressed for configurations with wide separation of two or more carriers. Thus, system efficiency is affected by efficiency of having a single switching power supply to provide envelope tracking, as well as reduced efficiency of a power amplifier provided with less efficient or closeness of envelope tracking by a drain current associated with widely separated carriers.

Accordingly, it would be useful and desirable to provide envelope tracking which overcomes one or more of the above-described limitations.

SUMMARY

An apparatus relates generally to a multiband envelope tracking power amplifier. In such an apparatus, there is a first power supply and a second power supply. The first power supply and the second power supply are each narrow-banded. A digital predistorter is coupled to provide separate bands of a modulation signal for respective input of a first band of the bands to the first power supply and a second band of the bands to the second power supply. The first power supply generates a first power at a first center frequency. The second power supply generates a second power at least at a second center frequency spaced apart from the first center frequency for a wide-band configuration. The second power output from the second power supply is coupled to the first power output from the first power supply to provide a multiband power modulation output.

Another apparatus relates generally to a multiband envelope tracking power amplifier. In such an apparatus, there is a first power supply, a second power supply, and a third power supply. The first power supply, the second power supply and the third power supply are each narrow-banded. A digital predistorter is coupled to provide separate bands of a modulation signal for corresponding inputs to the first power supply, the second power supply, and the third power supply. The first power supply generates a first power at a first center frequency. The second power supply generates a second power at a second center frequency spaced apart from the first center frequency. The third power supply generates a third power at a third center frequency spaced apart from both the first center frequency and the second center frequency for a wide-band configuration. The second power output from the second power supply and the third power output from the third power supply are each coupled to the first power output from the first power supply to provide a multiband power modulation output.

A method relates generally to operation of a multiband envelope tracking power amplifier. In such a method, a modulation signal is generated with a digital predistorter. A first band and a second band of the modulation signal are respectively provided to a first power supply and a second power supply. First power at a first center frequency is generated with the first power supply for envelope tracking responsive to the first band of the modulation signal. Second power at a second center frequency is generated with the second power supply for envelope tracking responsive to the second band of the modulation signal. The first power supply and the second power supply are each narrow-banded. The second center frequency is spaced apart from the first center frequency for a wide-band configuration. The second power is coupled to the first power to provide a multiband power modulation output.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

As described below in additional detail, a multiband power supply module is provided having a plurality of narrow band power supplies to collectively cover a wide-band configuration of multiple carriers. Each of these power supplies involves substantially less complexity than a single power supply, including without limitation a single switching power supply, spanning a comparable wide-band configuration. Furthermore, such collection of narrow band power supplies may produce outputs which are coupled to one another to provide drain modulation for a power amplifier, and such coupled outputs may provide a higher degree of accuracy of envelope tracking than drain modulation from a single switching power supply covering a comparable wide-band configuration.

With the above general understanding borne in mind, various configurations for a transmitter or a transmitter portion of a transceiver are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
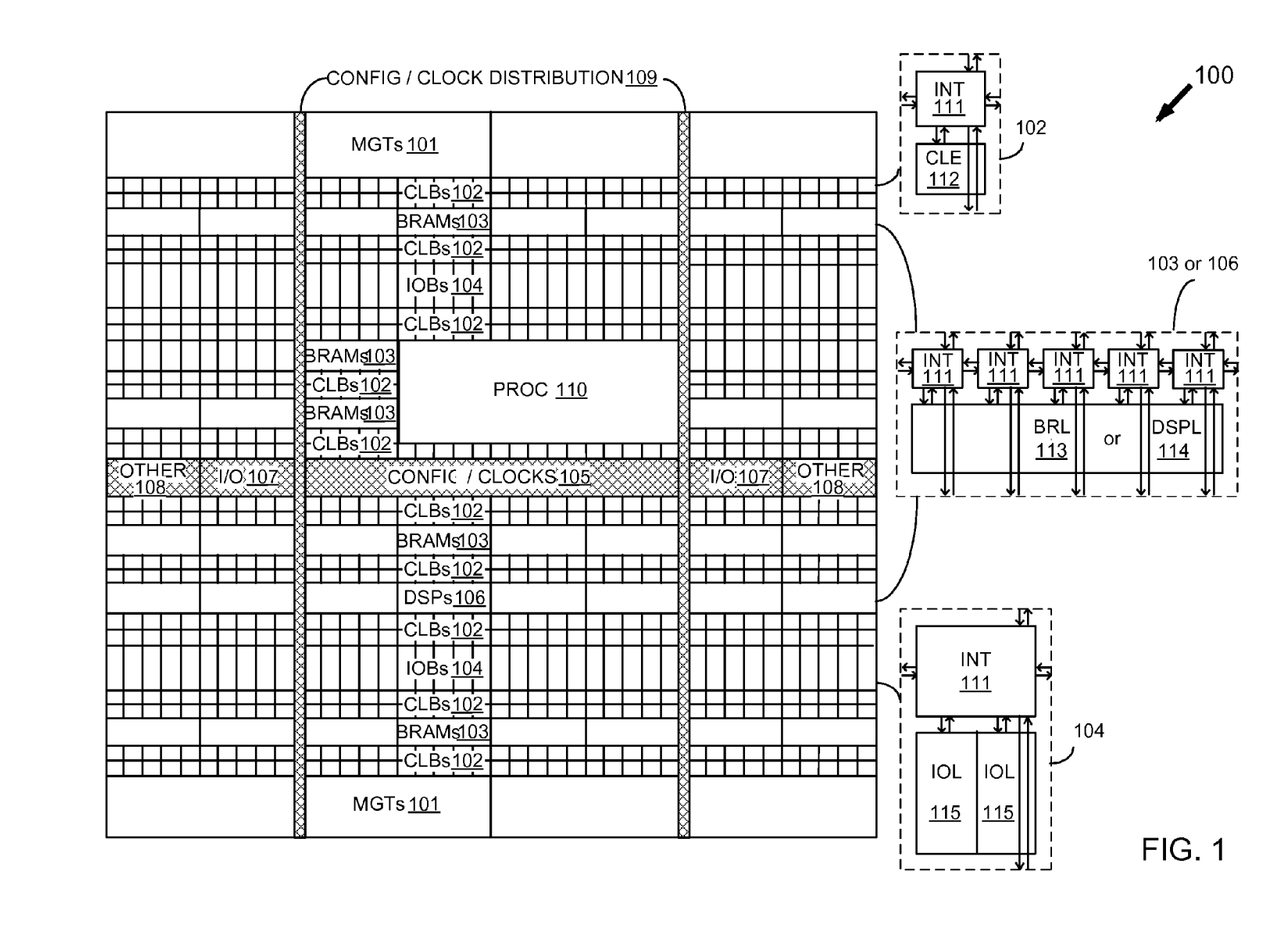
FIG. 1 is a simplified block diagram depicting an exemplary columnar Field Programmable Gate Array ("FPGA") architecture.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2A:
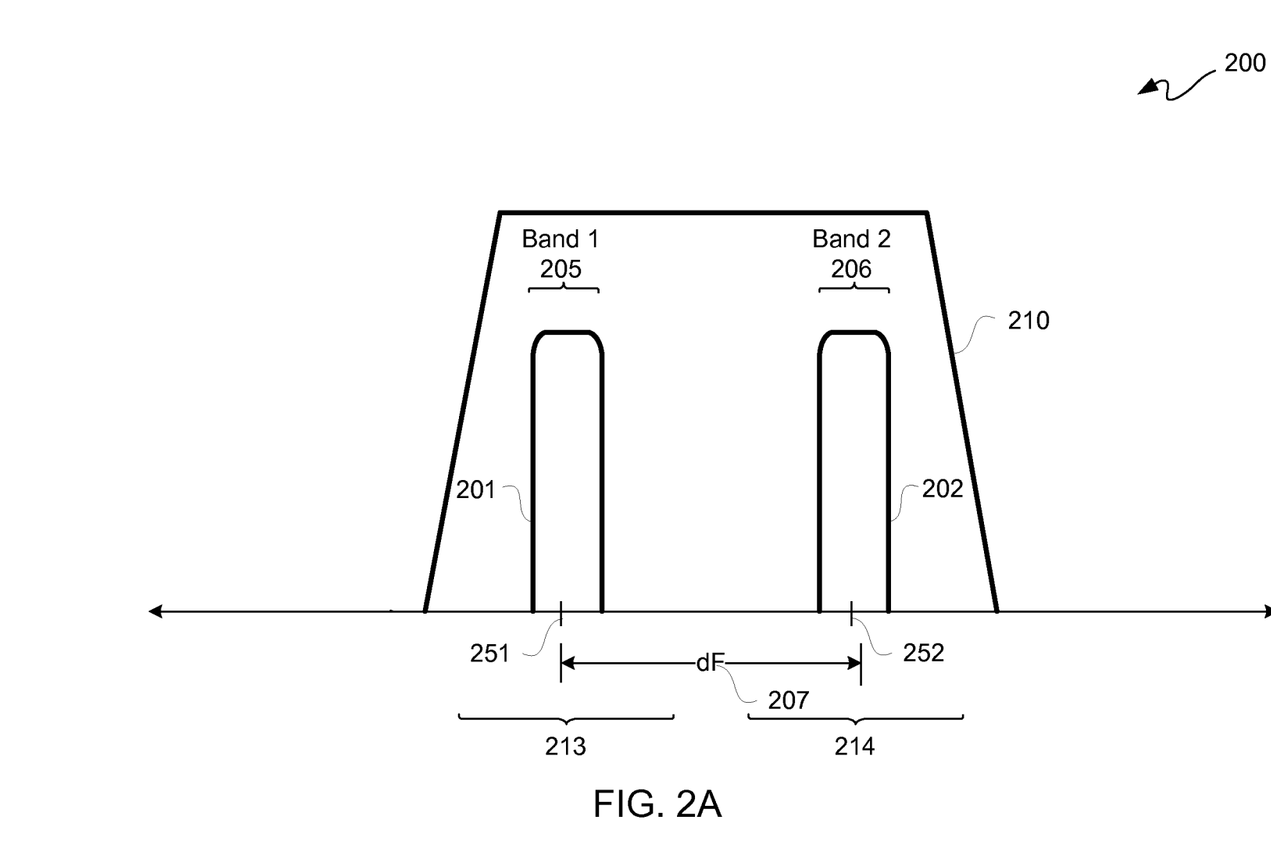
FIG. 2A is a graphical diagram depicting an exemplary conventional multiband base station RF output.

Before proceeding further with the detailed description, a more complete description of a problem is provided by an example for purposes of clarity with reference to FIG. 2A. FIG. 2A is a graphical diagram depicting an exemplary conventional multiband base station RF output 200. Cavity filter response 210 is for a bandwidth that encompasses two operating bands, as generally indicated as carrier stack 201 and carrier stack 202 in an RF band. In this example, each operating band 205 and 206 respectively of carrier stacks 201 and 202 is 20 MHz. These non-overlapping operating bands 205 and 206 are separated by a difference frequency 207, which may generally be regarded as a guard bandwidth or guard band 207. In this example, guard band 207 from center frequency 251-to-center frequency 252 respectively of carrier stack 201 and carrier stack 202 is 120 MHz, which is substantially larger than the bandwidth of each of operating bands 205 and 206. It should be understood that these and other numerical examples used herein are for purposes of clarity and not limitation, and accordingly these or other bandwidths may be used unless expressly indicated otherwise.

Figure 2B:
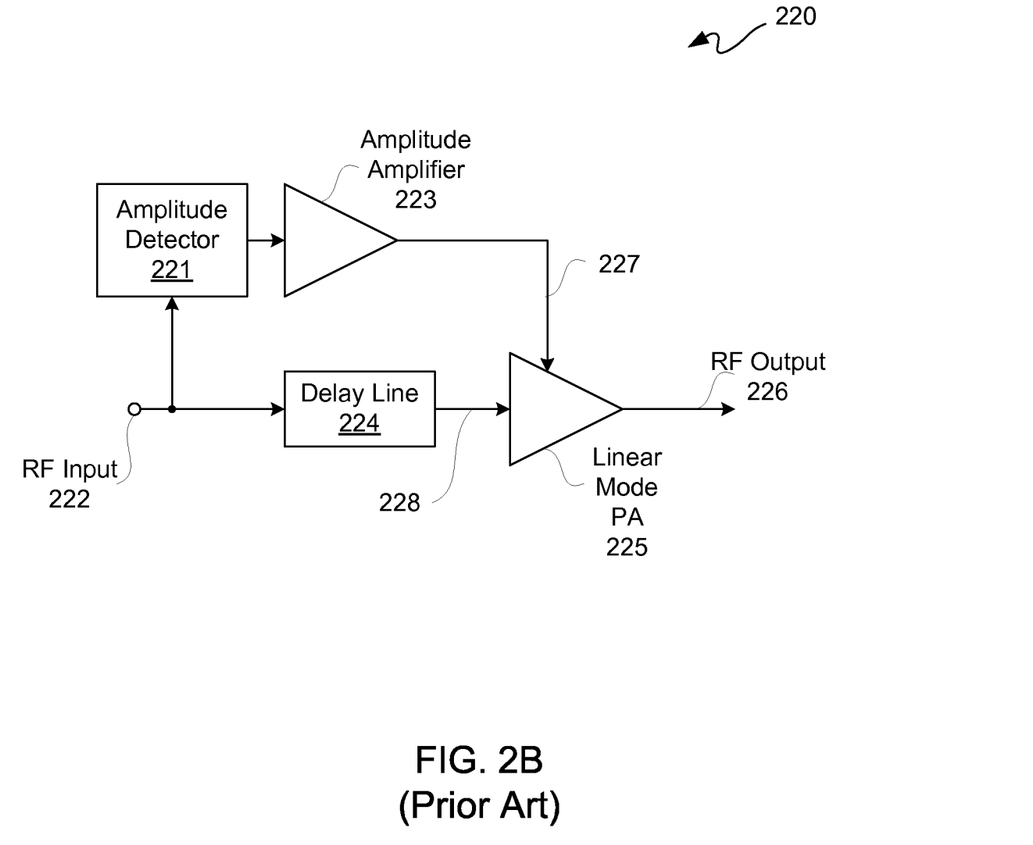
FIG. 2B is a block diagram depicting an exemplary conventional envelope tracking power amplifier ("ET PA").

FIG. 2B is a block diagram depicting an exemplary conventional envelope tracking power amplifier ("ET PA") 220. ET PA 220 includes an amplitude detector 221, an amplitude amplifier 223, a delay line 224, and a linear mode power amplifier ("PA") 225. An RF input 222 is provided as a signal input to amplitude detector 221 and as a signal input to delay line 224. Bandwidth of amplitude detector determines whether ET PA 220 responds to a long-term average of an envelope (AET or Auxiliary Envelope Tracking) or instantaneous variations in an envelope (WBET or Wide-Bandwidth Envelope Tracking). Detected amplitude of RF input 222 output from amplitude detector 221 is provided as a signal input to amplitude amplifier 223. An amplified detected amplitude signal 227 output from amplitude amplifier 223 is provided as a control signal to a linear mode PA 225, which may for example be a class A, AB, or B amplifier. Output from delay line 224 is provided as a delayed version of RF input 222, namely delayed RF input 228, as a signal input to linear mode PA 225. Timing of input of delayed RF input 228 to linear mode PA 225 corresponds to timing of application of amplitude signal 227 for envelope tracking by linear mode PA 225, as is known, for outputting an RF output 226 from linear mode PA 225. However, a significant challenge in construction of an ET PA 225 is providing a high efficiency wideband power supply for amplitude amplifier 223 for such envelope tracking.

As described below in additional detail, by processing power by band, total bandwidth provided by a power supply module may be at least substantially reduced. Moreover, by processing individual carriers where occupied bandwidth ("BW") therefor is small compared to a total bandwidth, a more economical result may be obtained by processing power each individual band. For example, in some multi-carrier GSM ("MC-GSM") systems, for example where a carrier BW is approximately 200 KHz and two or more carriers are spaced 1 MHz or more from each other on a regular channelization scheme, a significant savings may be obtained by processing each power band separately, as described below in additional detail, and performance advantages by envelope tracking for providing a drain current to a power amplifier may be obtained. MC-GSM is just one example, and other communication protocols may be used. However, continuing the MC-GSM example, there may be six carriers in 30 MHz of bandwidth, where occupied bandwidth is 6*200 KHz=1.2 MHz. This may be only 4% of the total bandwidth for such MC-GSM example.

Even though each of the following processing steps may be implemented in an FPGA, such description is not limited to implementation in an FPGA. Along those lines, each of the following digital predistorters may be implemented in any IC, including without limitation another type of SoC, an ASIC, an ASSP, or the like, whether a monolithic IC or an SiP.

Figure 3:
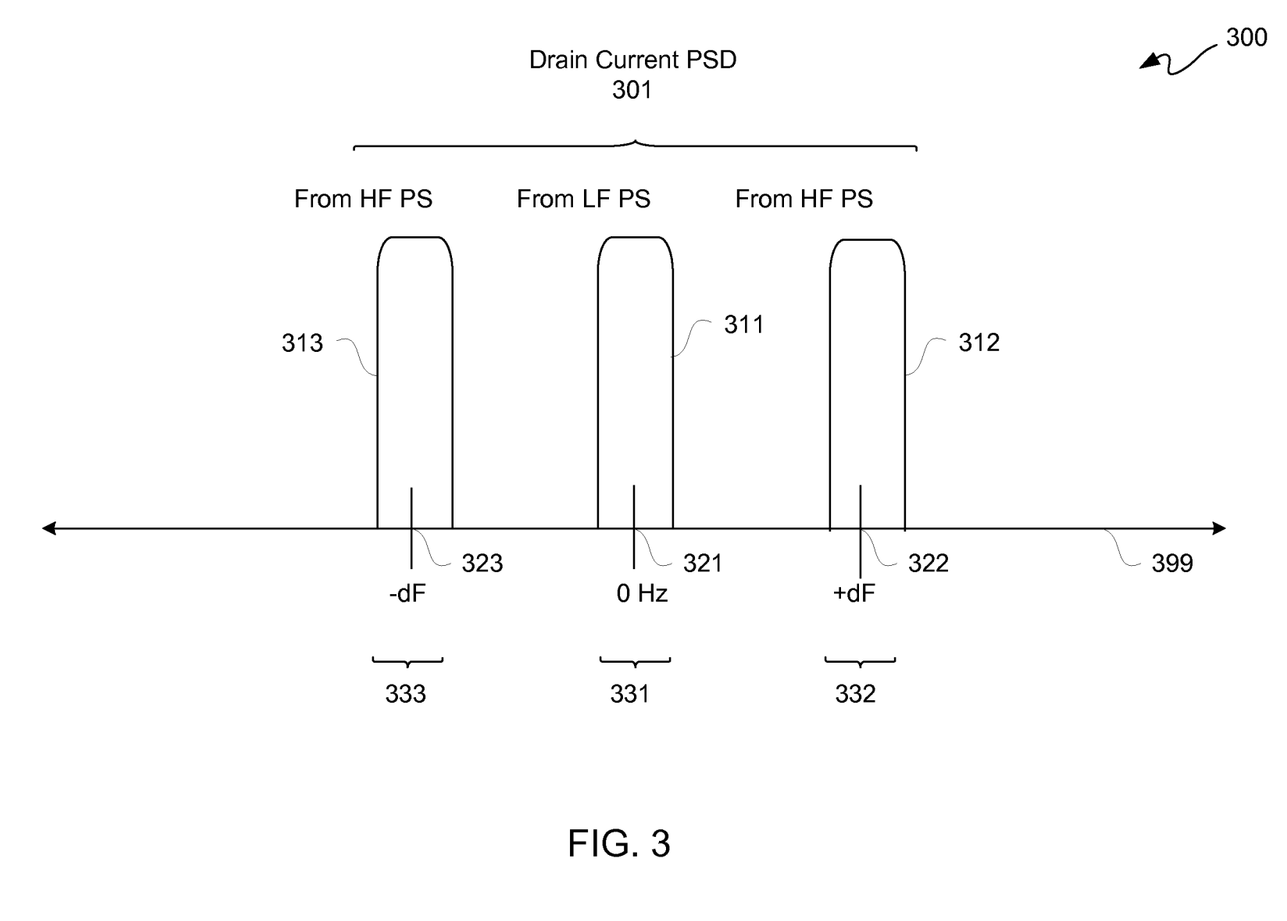
FIG. 3 is a graphical diagram depicting an exemplary linear multiband power supply response for envelope tracking.

FIG. 3 is a graphical diagram depicting an exemplary linear multiband power supply response 300 for envelope tracking. Such envelope tracking may be for a wide band multiband carrier configuration. By wide-band multiband carrier configuration or wide-band configuration, it is generally meant having at least two center frequencies of at least two corresponding bands or carrier stack bandwidths widely spaced apart compared to each band's bandwidth. For two or more widely separated carriers, drain current power supply power spectral density ("PSD") 301 for drain modulation may have a plurality of power bands spaced apart from one another. For purposes of clarity by way of example and not limitation, it shall be assumed that there are two carriers or bands; however, in other configurations there may be more than two bands. As generally indicated along a horizontal axis 399 for frequency, a power band or power 311 may be at a center frequency 321 of 0 Hz, namely centered at DC, and powers 312 and 313 may be centered at different carrier difference frequencies corresponding to the second order intermodulation products of each composite signal to be transmitted in operating bands 205 and 206. Returning to FIG. 2, a carrier difference frequency 207 is such a carrier difference frequency.

Powers 312 and 313 are respectively centered at plus and minus carrier difference frequencies 322 and 323 on either side of center frequency 321. Bandwidths 331 through 333 respectively of each frequency zone of powers 311 through 313 are equal to or approximately equal to twice the maximum bandwidth of signals in each band of such bands.

Drain modulation may be provided as a sum of two or more different sources that each have a bandwidth equal to or approximately equal to twice the maximum bandwidth of signals in each band of such bands. In this example, power 311 is provided from a "low frequency" power supply, and powers 312 and 313 are provided from a "high frequency" power supply.

Figure 4:
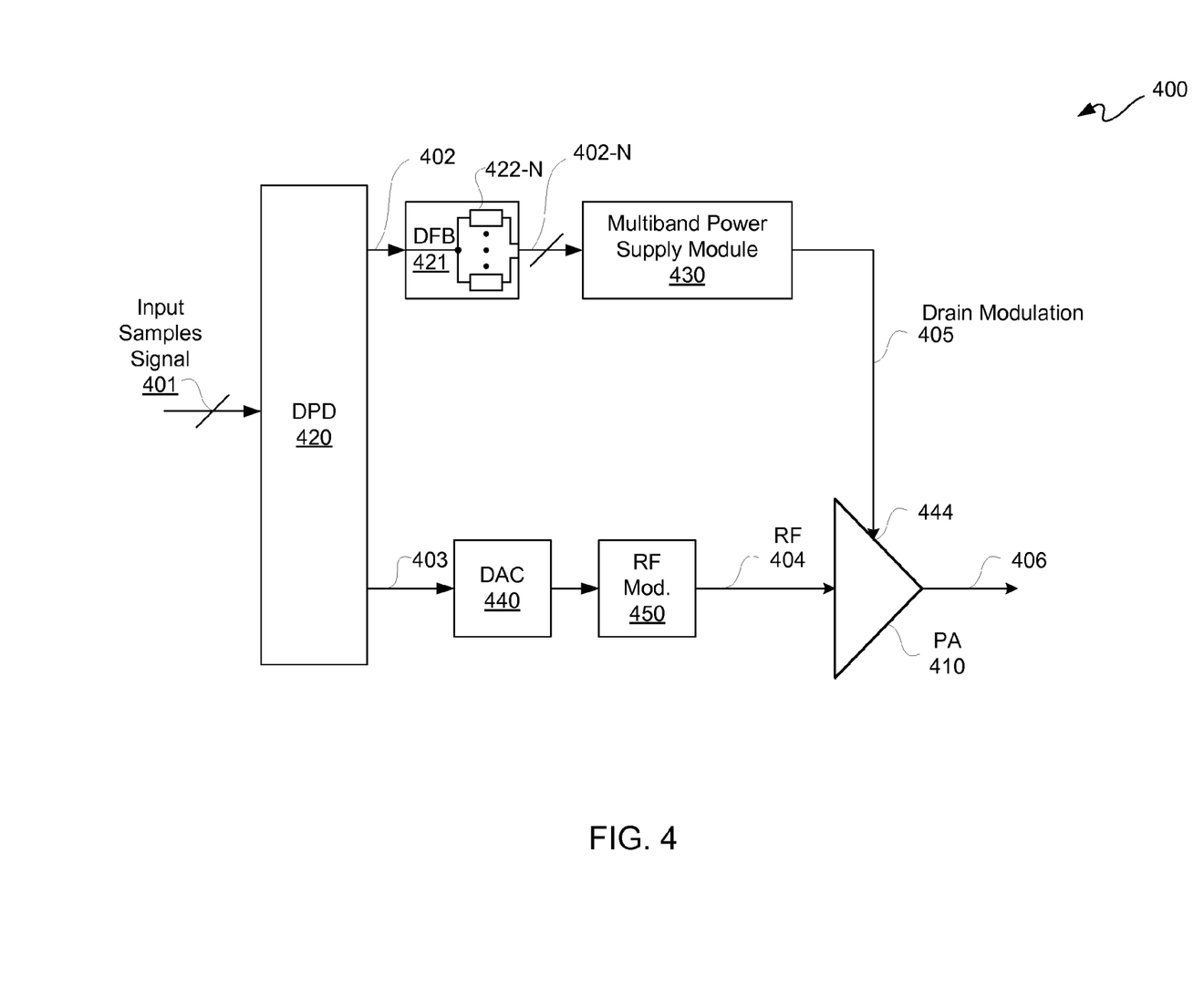
FIG. 4 is a block diagram depicting an exemplary portion of a transmitter.

FIG. 4 is a block diagram depicting an exemplary portion of a transmitter 400. Transmitter 400 includes a digital predistorter ("DPD") 420, a multiband power supply module 430, a digital-to-analog converter 440, an RF modulator 450, and a power amplifier 410. Power amplifier 410, DPD 420, and multiband power supply module 430 may be components of a multiband envelope tracking power amplifier. A digital filter bank ("DFB") 421, which may be incorporated into DPD 420, or separate therefrom, may be included, as described below in additional detail. For purposes of clarity by way of example and not limitation, it shall be assumed that DFB 421 is external to DPD 420. Some known components of transmitter 400 have not been illustratively depicted for purposes of clarity and not limitation.

DPD 420, DFB 421, and/or DAC 440 may be incorporated into a same IC or multiple ICs, such as with one or more ASICs, ASSPs, and/or FPGAs. For example, for an FPGA implementation, multiple DSP blocks or slices 106 of FPGA 100 of FIG. 1 may be used for implementation of DPD 420, DFB, 421, and/or DAC 440.

Figure 5:
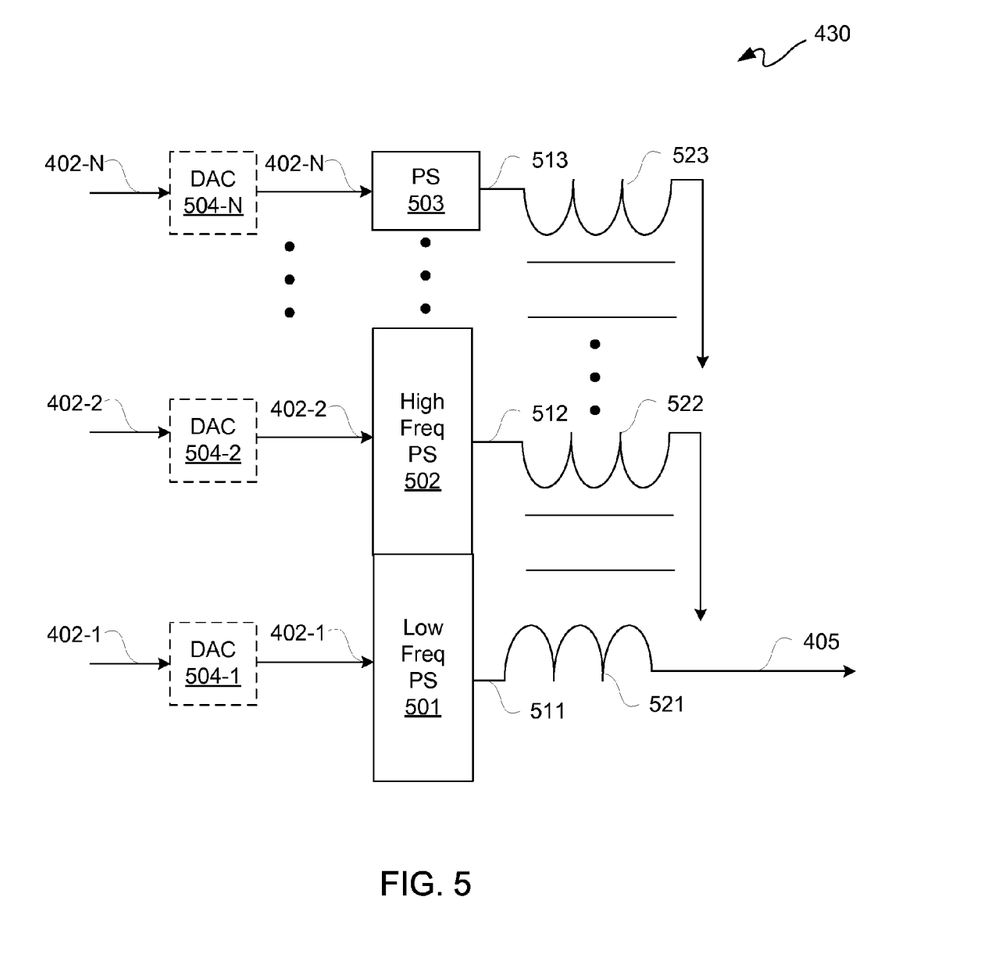
FIG. 5 is a block diagram depicting an exemplary multiband power supply module.

FIG. 5 is a block diagram depicting an exemplary multiband power supply module 430. Multiband power supply module 430 includes a "low frequency" or "LF" power supply ("PS") 501 and a "high frequency" or "HF" power supply 502. Multiband power supply module 430 may include more than two power supplies, such as power supplies 501 through 503 for example to handle more than two bands. Along those lines, power supplies 501 to 503 may be coupled to respectively receive an input modulation signal 402-N on an input side and commonly inductively coupled on an output side to provide a drain modulation signal 405. Power supplies 501 through 503 may respectively be coupled to windings 521 through 523. Transformer windings of the composite transformer with windings 521 through 523 may be respectively coupled to receive output powers or power bands 511 through 513, and transformer windings 521 through 523 may be proximately positioned with respect to one another to inductively couple output powers 511 through 513 to provide drain modulation signal 405, as an analog signal. Power supplies 501 through 503 are switching power supplies, and these high frequency power supplies may be implemented as a class E, F or other high efficiency RF power source. Furthermore, power supplies 501 through 503 each only cover a narrow band. By narrow band or narrow-banded, it is generally meant a band or carrier stack signal bandwidth that is 40 MHz or less in bandwidth. For purposes of clarity, it shall be assumed that only two bands are to be processed, and thus only power supplies 501 and 502 may be present. However, from the following description, it should be understood that more than two bands may be processed.

With simultaneous reference to FIGS. 3 to 5, transmitter 400 is further described. A DPD 420 may be coupled to receive input samples signal 401. More particularly, input samples signal 401 may be two or more different input signals for two or more corresponding different bands for a wideband configuration. DPD 420 may be configured to provide a modulation signal 402 output and a digital predistorted signal 403, which is a digital predistorted version of input samples signal 401 as known.

DFB 421 may be coupled on an input side to receive modulation signal 402 to parse such signal into separate bands. Along those lines, DFB 421 may include a plurality of digital filters 422-N, for N an integer number of such bands or power supplies. Digital filters 422-N may be commonly coupled to receive modulation signal 402 to respectively provide N band specific modulation signals thereof, namely corresponding modulation signals 402-N. Power supply 501 and power supply 502 of multiband power supply module 430 may be respectively coupled on an input side for receiving a modulation signal of modulation signals 402-N from DFB 421. Optionally, modulation signals 402-N may be provided to corresponding optional DACs 504-N of multiband power supply module 430 for conversion of modulation signals 402-N from respective band specific digital signals to corresponding analog versions thereof for respective input to power supplies 501 and 502. Thus, for example, band specific digital modulation signals 402-1 and 402-2 for separate bands, such as an LF band and an HF band, may be respectively input to optional DACs 504-1 and 504-2 to provide corresponding analog modulation signals 402-1 and 402-2 to HF PS 502 and LF PS 501. However, for purposes of clarity by way of example and not limitation, it shall be assumed that power supplies 501 and 502 are each configured to receive a respective input digital signal and provide a corresponding analog power output signal; even though, in other configurations each of power supplies 501 and 502 may be configured to receive an analog input signal. For purposes of clarity and not limitation, modulation signal 402 is generally described below as being provided to multiband power supply module 430 with the understanding that such modulation signal 402 may be represented as band specific modulation signals 402-N output from DFB 421.

Power supply 501 is configured to generate a power 511 at a center frequency for a first narrow band. As power supply 501 is a "low frequency" power supply as between power supplies 501 and 502, such center frequency may be center frequency 321. Power supply 502 is configured to generate a power 512 at another center frequency therefor for a second narrow band, which may or may not be equal in bandwidth to such first narrow band. As power supply 502 is a "high frequency" power supply as between power supplies 501 and 502, such other center frequency may be center frequency 322 or 323. At least one narrow band centered at either of center frequency 322 or 323 may be produced by power supply 502. Thus, each of power supplies 501 and 502 is narrow banded, though collectively power supplies 501 and 502 may support a wide-band configuration.

Again, center frequency 322 or 323 is spaced apart from center frequency 321. Center frequency 321, in addition to being a center frequency of a narrow power band of power 511, may be considered to be at an overall center of a spectral distribution of power from multiband power supply module 430. Center frequencies 322 and 323, which are effectively frequency negatives of one another and so both may be generated from a same source, are center frequencies with respect to their corresponding narrow power bands of output power 512.

Power 512 output from power supply 502 may be inductively coupled to power 511 output from power supply 501 to provide a multiband power modulation output, which may be drain modulation 405. Drain modulation 405 may have a linear multiband power supply response 300 for envelope tracking of each band of input samples signal 401. More particularly, drain modulation 405 provides a modulation associated with modulation signal 402 and thus may be for envelope tracking of an RF analog signal 404 input to PA 410, where such RF analog signal 404 is an analog version of digital predistorted signal 403 after passing through DAC 440. Such analog signal output from DAC 440 may be input to a modulator 450 to produce an RF analog signal 404. An amplified version, namely transmission signal 406, of RF analog signal 404 may be provided as a power modulated signal responsive to drain modulation 405. In other words, power amplifier 410 envelope tracks RF analog signal 404 using drain modulation 405 to provide transmission signal 406, which envelope tracking may improve efficiency of power amplifier 410 in amplifying RF analog signal 404 to provide transmission signal 406. It should further be appreciated that such envelope tracking is for each of a plurality of bands of RF analog signal 404.

Drain modulation 405 may be a drain current. Power amplifier 410 may be coupled to receive such drain current to a supply port 444 of power amplifier 410 for envelope tracking of RF input 404 to power amplifier 410. Generally, power amplifier 410 may be coupled to receive an analog signal associated with a converted form of a digital predistorted signal output from DPD 420 and an analog multiband power modulation signal to envelope track such analog signal input.

Power supply 501 in this example provides power 511 at DC for center frequency 321. Power supply 501 may have a supply bandwidth 331 of at least twice a maximum bandwidth of a largest signal bandwidth of signals in a band 205 of carrier stack 201, which is a narrow band as compared with a wide-band configuration of multiple bands. Again, carrier signal or stack 201 is one of a plurality of carrier signals, such as for example carrier signals 201 and 202, for multiband power modulation output.

Power supply 502 in this example provides a tone with power 512 at a difference frequency, where such difference frequency is a difference as between center frequency 321 and either of center frequencies 332 and 333. Power supply 502 may have a supply bandwidth 332 and a negative equivalent supply bandwidth 323, each of which is a narrow band as compared with a wide-band configuration of multiple carriers. Each such supply bandwidth 332 and 333 may be at least twice a maximum bandwidth of a largest signal bandwidth of signals in a band 206 of carrier stack 202. In this example, power supply 501 has a supply bandwidth 331 which is equal in width to each of supply bandwidths 332 and 333 of power supply 502. However, in other configurations, supply bandwidths of power supplies 501 and 502 may be different from one another.

If there were a third band or carrier in the above example, then power supplies 501 through 503 may be used in multiband power supply module 430. In such a configuration, a single DPD 420 may be commonly coupled to provide a modulation signal 402 for input to each of such power supplies 501 through 503. Power supplies 501 and 502 may be for generating respective narrow-banded powers 511 and 512 at corresponding spaced apart center frequencies, as previously described, and additionally power supply 503 may be for generating a narrow-banded power 513 at yet another center frequency spaced apart from each of center frequencies 321 through 333. Again, powers 511 through 513 respectively from power supplies 501 through 503 may be commonly inductively coupled to provide a multiband power modulation output, such as a drain modulation 405, to support a wide-band configuration for envelope tracking by a power amplifier 410, as previously described. Such power supply 503 may additionally provide another tone with power 513 at another difference frequency, where such other difference frequency is between center frequency 321 and either a plus or minus center frequency of a narrow band of power 513.

Along the above lines, if bandwidth of a band or bands is too wide for the frequency response of a power supply, then such band or bands may be subdivided or further subdivided, and power supplies may be added corresponding to each additional band, with each such power supply respectively providing operational power in each band.

Figure 6:
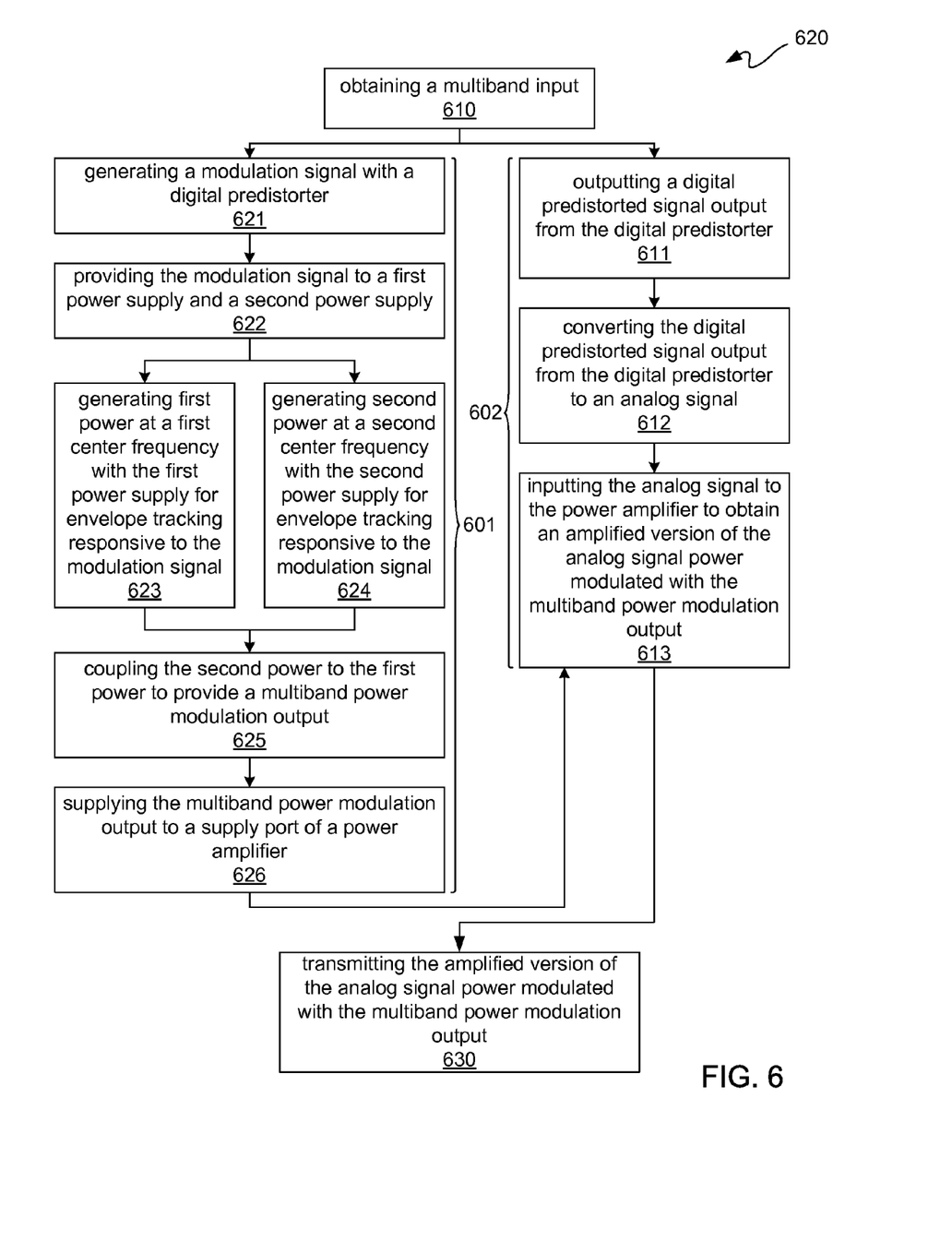
FIG. 6 is a flow diagram depicting an exemplary power amplifier modulation flow.

FIG. 6 is a flow diagram depicting an exemplary power amplifier modulation flow 600. Power amplifier modulation flow 600 is further described with simultaneous reference to FIGS. 3 through 6.

At 610, a multiband input for a wide-band configuration of carriers is obtained, such as input samples signal 401 for example. A modulation path 601, which includes operations at 621 through 626 may be performed in parallel with a signal processing path 602, which includes operations at 611 through 613.

At 621, a modulation signal 402 is generated with a DPD 420. In parallel with operation 621, at 611 such DPD 420 outputs a digital predistorted signal 403. At 612 from 611, such digital predistorted signal 403 may be converted to an RF analog signal 404 by DAC 440 and modulator 450. Optionally, DPD 420 may additionally modify an envelope tracking signal, such as a predistorted version of modulation signal 402 for example, to effectively predistort power supply signals output by power supplies of multiband power supply module 430.

At 622 from 621, such modulation signal 402 may be provided to narrow-banded power supplies 501 and 502 of multiband power supply module 430. At 623 from 622, power 511 may be generated by power supply 501 at a center frequency 321 of a narrow band for envelope tracking responsive to modulation signal 402. In other words, power 511 envelops and tracks analog signal 404 for a narrow band centered at center frequency 321. Likewise, at 624 from 622 and in parallel with 623, power 512 may be generated by power supply 502 at least at one of center frequencies 322 and 323 for envelope tracking responsive to modulation signal 402. In other words, power 512 envelops and tracks analog signal 404 for a narrow band centered at center frequency 322 and another frequency band centered at frequency 323. Center frequency 321 is spaced apart from center frequency 322 and center frequency 323 at least such that associated bands do not overlap with one another for providing a wide-band configuration. Furthermore, center frequency 321 may be spaced-apart from center frequency 322 and center frequency 323 such that IMD associated with bands of such center frequencies do not overlap with one another for such wideband configuration. Center frequencies 322 and 323 may be the same frequency though with opposite signs. From 623 and 624, at 625 power 512 may be coupled, such as inductively coupled for example, to power 511 to provide a multiband power modulation output, such as drain modulation 405 for example. At 626, such multiband power modulation output may be supplied or otherwise input to a supply port 444 of power amplifier 410.

At 613 from 612, such RF analog signal 404 may be input to power amplifier 410 to obtain an amplified version of such analog signal 404 which is power modulated with such multiband power modulation output obtained by power amplifier 410 at 626. In other words for example, analog signal 404 is envelope tracked for each of a plurality of bands of analog signal 404 using drain modulation 405 supplied at supply port 444 to increase efficiency of operation of power amplifier 410 for producing such an amplified version of analog signal 404. Thus, in addition to be amplified, analog signal 404 may be power modulated with drain modulation 405 to more efficiently provide transmission signal 406. At 630, transmission signal 406 may be transmitted after having been power modulated with such multiband power modulation output obtained at 626.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
    a first power supply;
    a second power supply;
    the first power supply and the second power supply each being narrow-banded;
    a digital predistorter coupled to provide separate bands of a modulation signal for respective input of a first band of the bands to the first power supply and a second band of the bands to the second power supply;

the first power supply for generating a first power at a first center frequency;

the second power supply for generating a second power at least at a second center frequency spaced apart from the first center frequency for a wide-band configuration; and the second power output from the second power supply coupled to the first power output from the first power supply to provide a multiband power modulation output.

2. The apparatus according to claim 1, wherein the multiband power modulation output is a drain current.

3. The apparatus according to claim 2, further comprising a power amplifier coupled to receive the drain current to a supply port of the power amplifier.

4. The apparatus according to claim 3, wherein the power amplifier is coupled to receive an analog signal associated with a converted form of a digital predistorted signal output from the digital predistorter.

5. The apparatus according to claim 1, wherein the first power supply provides the first power at DC for the first center frequency.

6. The apparatus according to claim 1, wherein the first power supply has a first supply bandwidth of at least twice a maximum bandwidth of signals in a carrier stack.

7. The apparatus according to claim 6, wherein:
the carrier stack is one of a plurality of carrier signals for the multiband power modulation output; and
the digital predistorter includes a digital filter bank to provide the separate bands of the modulation signal.

8. The apparatus according to claim 7, wherein the second power supply provides a tone with the second power at a difference frequency, the difference frequency being a difference as between the first center frequency and the second center frequency.

9. The apparatus according to claim 2, further comprising a digital filter bank coupled to receive the modulation signal from the digital predistorter to provide the separate bands of the modulation signal.

10. An apparatus, comprising:
a first power supply;
a second power supply;
a third power supply;
the first power supply, the second power supply and the third power supply each being narrow-banded;
a digital predistorter coupled to provide separate bands of a modulation signal for corresponding inputs to the first power supply, the second power supply, and the third power supply;
the first power supply for generating a first power at a first center frequency;
the second power supply for generating a second power at a second center frequency spaced apart from the first center frequency;
the third power supply for generating a third power at a third center frequency spaced apart from both the first center frequency and the second center frequency for a wide-band configuration; and
the second power output from the second power supply and the third power output from the third power supply each coupled to the first power output from the first power supply to provide a multiband power modulation output.

11. The apparatus according to claim 10, wherein:
the multiband power modulation output is a drain modulation; and
a digital filter bank is coupled to receive the modulation signal from the digital predistorter to provide the separate bands of the modulation signal.

12. The apparatus according to claim 10, wherein:
the multiband power modulation output is a drain current; and
the digital predistorter includes a digital filter bank to provide the separate bands of the modulation signal.

13. The apparatus according to claim 12, further comprising:
a power amplifier coupled to receive the drain current to a supply port of the power amplifier; and
the power amplifier coupled to receive an analog signal associated with a converted form of a digital predistorted signal output from the digital predistorter.

14. The apparatus according to claim 12, wherein the first power supply provides the first power at DC for the first center frequency.

15. The apparatus according to claim 12, wherein the first power supply has a first supply bandwidth of at least twice a maximum bandwidth of signals in a carrier stack.

16. The apparatus according to claim 15, wherein the carrier stack is one of a plurality of carrier signals having different bands for the multiband power modulation output.

17. The apparatus according to claim 15, wherein:
the second power supply provides a first tone with the second power at a first difference frequency between the first center frequency and the second center frequency; and
the third power supply provides a second tone with the third power at a second difference frequency between the first center frequency and the third center frequency.

18. A method, comprising:
generating a modulation signal with a digital predistorter;
providing a first band and a second band of the modulation signal respectively to a first power supply and a second power supply;
generating first power at a first center frequency with the first power supply for envelope tracking responsive to the first band of the modulation signal;
generating second power at a second center frequency with the second power supply for envelope tracking responsive to the second band of the modulation signal;
the first power supply and the second power supply each being narrow-banded;
the second center frequency spaced apart from the first center frequency for a wide-band configuration; and
coupling the second power to the first power to provide a multiband power modulation output.

19. The method according to claim 18, wherein:
the first power is provided at DC for the first center frequency; and
a tone is provided with the second power at a difference frequency as between the first center frequency and the second center frequency.

20. The method according to claim 19, further comprising:
supplying the multiband power modulation output to a supply port of a power amplifier;
outputting a digital predistorted signal output from the digital predistorter;
converting the digital predistorted signal output from the digital predistorter to an analog signal;
inputting the analog signal to the power amplifier to obtain an amplified version of the analog signal power modulated with the multiband power modulation output; and
transmitting the amplified version of the analog signal power modulated with the multiband power modulation output.

* * * * *